United States Patent [19]

Chin et al.

[11] Patent Number: 4,948,993
[45] Date of Patent: Aug. 14, 1990

[54] DISTRIBUTED SENSING CONTROL CIRCUIT FOR A SENSE AMPLIFIER OF THE MEMORY DEVICE

[75] Inventors: Dae-Je Chin; Chang-Hyun Kim, both of Seoul; Hong-Sun Hwang, Taegu, all of Rep. of Korea

[73] Assignee: Samsung Electronics Co. Ltd., Suwon, Rep. of Korea

[21] Appl. No.: 290,741

[22] Filed: Dec. 27, 1988

[30] Foreign Application Priority Data

Jun. 7, 1988 [KR] Rep. of Korea .................. 88-6797

[51] Int. Cl.⁵ .................. H01R 19/00; H03F 3/45
[52] U.S. Cl. .................. 307/530; 307/494; 365/205
[58] Field of Search .................. 365/203, 205; 307/530, 307/494

[56] References Cited

U.S. PATENT DOCUMENTS

| 4,031,522 | 6/1977 | Reed et al. .................. 307/530 |
|---|---|---|
| 4,533,843 | 8/1985 | McAlexander, III et al. ..... 307/530 |
| 4,543,500 | 9/1985 | McAlexander, III et al. ..... 307/530 |
| 4,543,501 | 9/1985 | McAlexander, III et al. ..... 307/530 |
| 4,545,037 | 10/1985 | Nakano et al. .................. 365/205 |
| 4,604,732 | 8/1986 | Van Tran .................. 307/530 |
| 4,764,693 | 8/1988 | Iwata .................. 307/530 |
| 4,813,021 | 3/1989 | Kai et al. .................. 365/203 |

Primary Examiner—Stanley D. Miller
Assistant Examiner—Richard Roseen
Attorney, Agent, or Firm—Ladas & Parry

[57] ABSTRACT

A distributed control circuit for a sense amplifier is provided in which each sense amplifier has a pair of sensing control transistors connected in serial with each sensing node of the sense amplifiers. Each gate of the sensing control transistors has a respective resistor connected in sequence from the gate of the uppermost sensing control transistor to the gate of the lowermost sensing transistor. A delay compensation resistor is connected by the unit of a sensing control transistor group having the number of the sensing control transistors as many as an integer k.

6 Claims, 5 Drawing Sheets

DISTRIBUTED SENSING CONTROL CIRCUIT FOR A SENSE AMPLIFIER OF THE MEMORY DEVICE

BACKGROUND OF THE INVENTION

1. FIELD OF THE INVENTION

The present invention relates to a distributed sensing control circuit for a sense amplifier of memory devices suitable for an integrated memory device.

2. DESCRIPTION OF THE PRIOR ART

As the memory density becomes higher, the number of sense amplifier circuits increases and total charge to be handled within a cycle becomes larger, which causes peak currents to rise, and signal voltages of bit lines and a sensing speed to lower. Consequently, the reliability of a memory device is degraded. The circuit arrangement of the prior art will be described with reference to FIG. 1.

A NMOS sensing control transistor $M_1$ and a PMOS sensing control transistor $M_2$ are connected to a precharge circuit PC. Each sense amplifier $SA_1$, $SA_2$, ..., $SA_n$ through each parasitic resistance R is connected in common with N and P MOS sensing control transistors $M_1$ and $M_2$, wherein the individual sense amplifier has the circuit arrangement, as shown in FIG. 4, in which the section "a" has a NMOS sense amplifier and the section "b" has a P MOS sense amplifier. The sensing control transistors $M_1$ and $M_2$ have gates through which sensing control signals $\overline{LA}$, LA from an external sense amplifier control circuit (not shown) are applied. The resistance R is a parasitic resistance resulted from a layout, and the value of resistance is small, typically about $5\Omega$.

In the prior circuit arrangement with the type of aforesaid configuration, the sensing control transistors $M_1$ and $M_2$, by $\overline{LA}$, LA signal, control the multiple of sensing amplifiers $SA_1$-$SA_n$, so that the value of currents varying with time di/dt increases because the peak currents Iccl and Issl, respectively (see FIG. 6), of the power supply line of $V_{cc}$ and $V_{ss}$ have a sharp increment when sensing nodes ($\overline{S}$, S) are charged and discharged at each $V_{cc}$, $V_{ss}$ through the sensing control transistors $M_1$, $M_2$.

Therefore, the component of inductance in the power supply line of $V_{cc}$ and $V_{ss}$ causes noises in $V_{cc}$ and $V_{ss}$ ($V_n$=L di/dt, where $V_n$ is noise voltages, L is inductance), and the signal voltage of the bit line and the sensing speed decrease with the operation of sense amplifiers.

The number of sense amplifiers to be connected to the sensing control transistors $M_1$ and $M_2$ increases with the increase of memory density. Accordingly, the total current through $M_1$ and $M_2$ transistors becomes larger. This slows down the sensing speed because it takes long time to discharge the sense amplifier voltage.

SUMMARY OF THE INVENTION

The present invention has been made in consideration of these problems and has its object to provide a distributed control circuit for a sense amplifier of a memory device in which each sense amplifier has a pair of sensing control transistors connected in serial with each sensing node of the sense amplifiers, each gate of the sensing control transistors having a respective resistor connected in sequential order from the gate of the uppermost sensing control transistor to the gate of the lowermost sensing transistor. A delay compensation resistor is connected with each group having the number of k (k is integer) of the sensing control transistors.

In the circuit arrangement according to the present invention, noises caused by peak currents in a power line for the time of sensing can be decreased, the operation of a sense amplifier be stabilized by the increase of a bit line signal voltage, and sensing speed be improved.

DESCRIPTION OF THE PREFERRED EMBODIMENTS

The circuit of the present invention will now be described in more detail with reference to the accompanying drawings.

Figure 1:
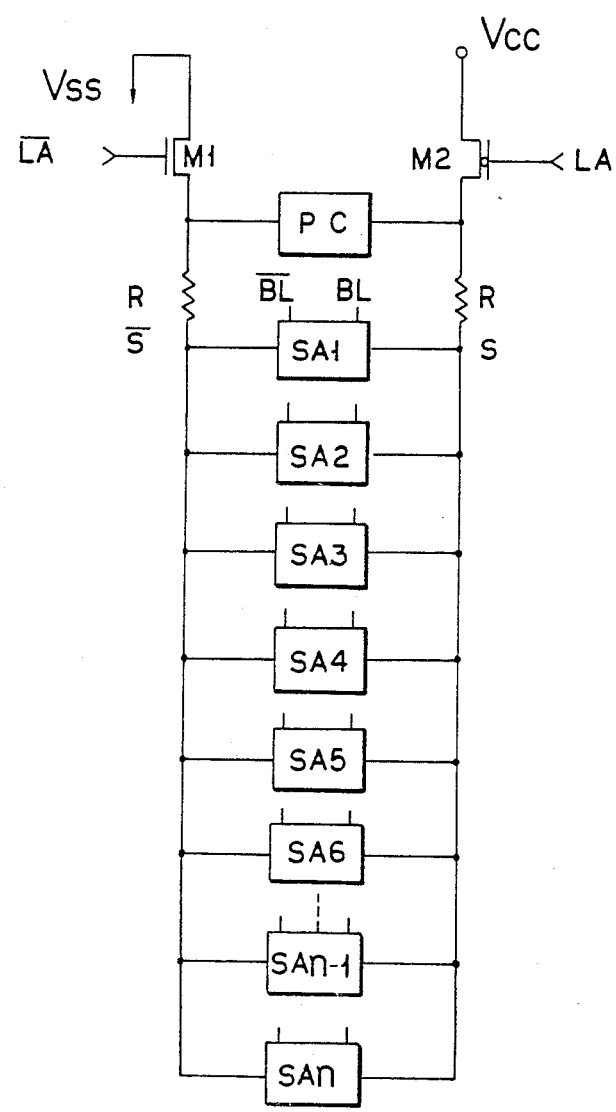
FIG. 1 is a prior control circuit of a sensing amplifier.
Figure 2:
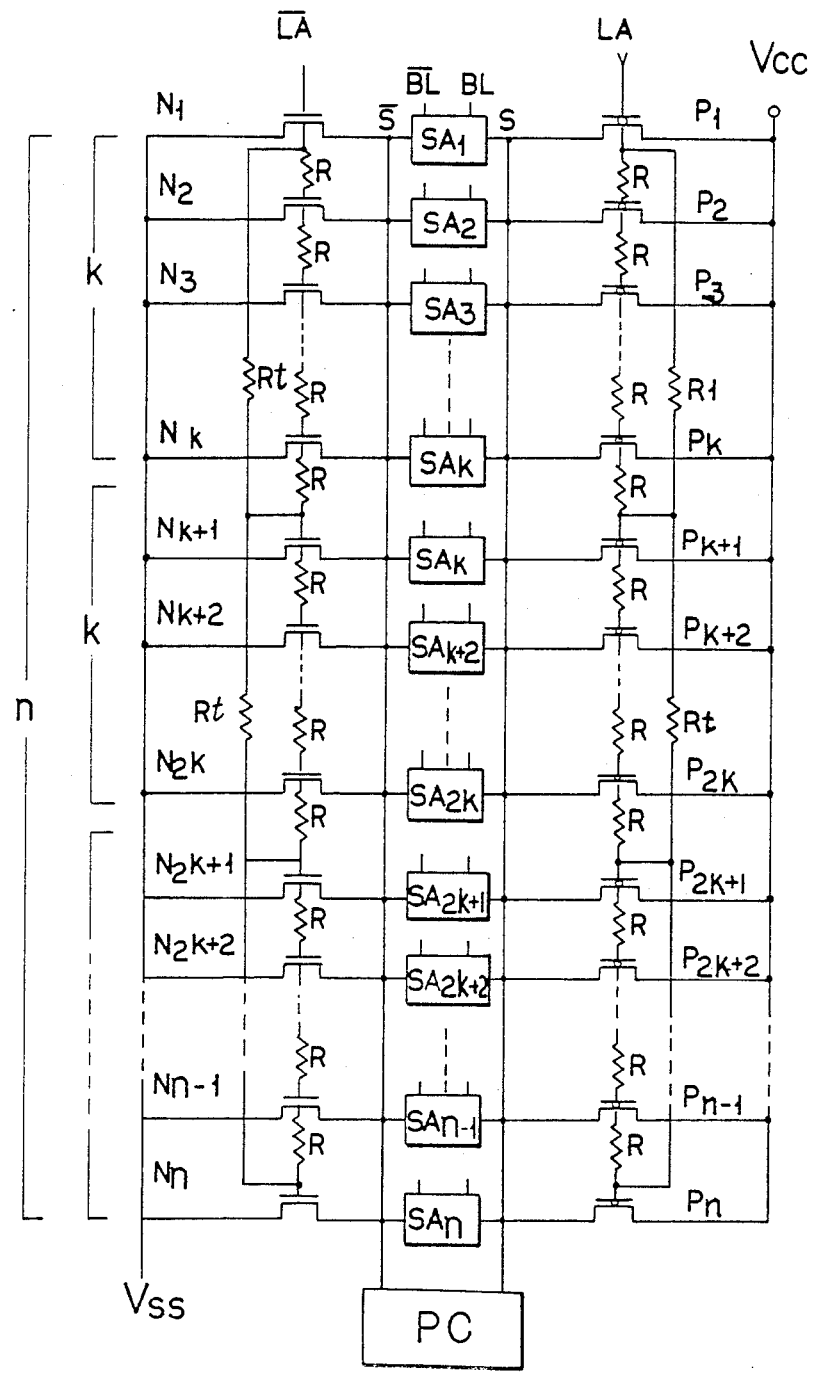
FIG. 2 is one embodiment of a distributed control circuit for a sense amplifier according to the present invention.

FIG. 2 illustrates an embodiment of the circuit according to the invention in which each of sense amplifiers $SA_1$-$SA_n$ is connected in common with a precharge circuit of $\frac{1}{2} V_{cc}$ PC, where $V_{cc}$ is a power supply voltage. Each of the sensing node $\overline{S}$ of the NMOS sense amplifier circuits is connected to each of corresponding NMOS sensing control transistors $N_1$-$N_n$. Similarly, each of the sensing node S of the PMOS sense amplifier circuits is connected to each of corresponding PMOS sensing control transistors $P_1$-$P_n$. Power supply voltages are applied to the circuit through the sensing control transistors.

The circuit of FIG. 2 comprises in addition a multiplicity of resistors. The respective gate of the N,PMOS sensing control transistors $N_1$-$N_n$, $P_1$-$P_n$ has a corresponding resistor. The resistors connected to each gate of the sensing control transistors have an arrangement in sequential connected order from the gate of the uppermost sensing control transistors to the gate of the lowermost sensing control transistors.

A delay compensation resistors $R_t$ are further included in the circuit of FIG. 2. The delay compensation resistors are connected in series one another, and one delay compensation resistor covers one group which has the sensing control transistors by k (integer) in number. As shown in FIG. 2, the sensing control transistors are grouped by the group divided as $N_1$-$N_k$, $N_{k+1}$-$N_{2k}$, ..., $P_1$-$P_k$, $P_{k+1}$-$P_{2k}$...

The pair of sensing control signals LA, $\overline{LA}$ are applied to the delay compensation resistors $R_t$ as well as the gate resistors R. In FIG. 2, the power supply voltage $V_{ss}$ is the level of ground. The resistances of the resistors R are the parasitic resistances resulted from the layout, and the delay compensation resistors $R_t$ are of low resistance.

This circuit operates as follows.

When the sensing control signal $\overline{LA}$ produced in an external control circuit of a sense amplifier turns a low level to a high level, the NMOS sensing control transistor $N_1$ is turned on. According to this, since the $\frac{1}{2} V_{cc}$ voltage in the sensing node $\overline{S}$ is discharged through the NMOS sensing control transistor $N_1$, the sense amplifier $SA_1$ senses data. At this time, the turn-on time of the other NMOS sense amplifiers $N_2-N_n$ is delayed by each of the resistors connected to each of the gates. Because of the delay of the sensing of each of the successive sense amplifiers, the rise in currents, Iss2 and Icc2 (see FIG. 6, hereinafter described) in the power lines connecting the various circuit elements between the terminals Vcc and Vss of a power supply, is incremental, as each sense amplifier is successively sensed, rather than all at once as would be if all the sense amplifiers were simultaneously sensed. This reduces the rate of change of current in the power lines, hence reduces the electrical noise generated by such changing currents.

Figure 6:
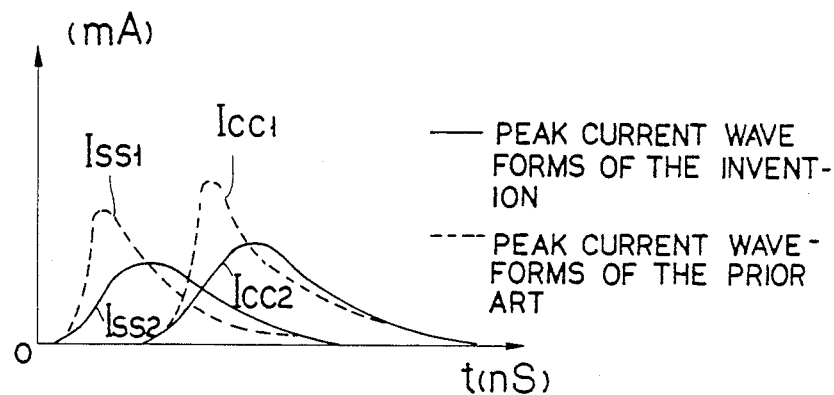
FIG. 6 shows a graph representative of a peak current waveform of the present invention in comparison with a prior peak current waveform.

Also, as shown in FIG. 6, the peak currents in the power lines are reduced in comparison with the prior known circuits.

Because of the presence of the delay compensation resistors Rt, however, not all the sense amplifiers are sequenced in order. Rather, as the sensing control signals LA and $\overline{LA}$ are applied to the first sensing control transistors N1 and P1 of the first sensing amplifier SA1, the sensing control signals are also applied, via the delay compensation resistors Rt, more or less simultaneously to the first sensing control transistors of each separate group of sense amplifiers. Thus, as the sense amplifiers $SA_1-SA_k$ of the first group are being successively sensed, the sense amplifiers of each group $(SA_{k+1}-SA_{2k}, SA_{2k+1}-SA_{3k}, \ldots)$ of amplifiers are also being successively sensed.

Figure 5:
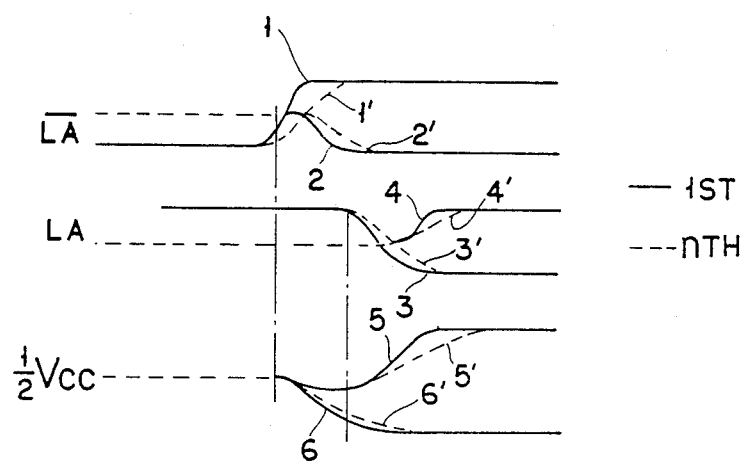
FIG. 5 illustrates an operational timing diagram of the present invention.

The resistance of the delay compensation resistors $R_t$ is small. Therefore, the effects on the sensing time can be neglected because the value of resistance $R_t$ is about several tens of ohms. By the resistance of the resistor $R_t$, some delays in sensing may be occured from the input port of the sensing control signal $\overline{LA}$ between the near sensing control transistor group and the remote sensing control transistor group. However, the difference of sensing time decreases the varying ratio with time di/dt in the currents $I_{ss}$. Accordingly, the magnitude of the peak currents is diminished. On the other hand, when the sensing control signal LA is turned a high level to a low level for an active restore, the PMOS sensing control transistor $P_1$ is switched on. Therefore, the sensing node of $P_1$ is charged from the $\frac{1}{2} V_{cc}$ voltage level to the $V_{cc}$ voltage level through the PMOS sensing control transistor $P_1$. Similarly, the other PMOS sensing control transistors $P_2-P_n$ are delayed in sequence by the resistor R connected to the gates. This charging procedure operates in the same manner as the discharging procedure having the sensing control signal $\overline{LA}$, because the delay compensation resistors $R_t$ are provided by the PMOS sensing control transistor group $P_1-P_k$, $P_{k+1}-, P_{2k}, \ldots$ FIG. 5 shows the graphical diagram representative of operational timing of the present invention. In FIG. 5, ① and ①' show the gate voltages of the sensing control resistor $N_1$ and $N_n$, respectively; ② and ②' illustrate the voltages at the sensing nodes $\overline{S}$ of each of the sense amplifiers $SA_1$, $SA_n$, respectively; ③ and ③' represent the voltages at the gates of the sensing control transistors $P_1$, $P_n$, respectively; ④ and ④' show the voltages at the sensing nodes S of each of the sense amplifiers $SA_1$, $SA_n$, respectively; ⑤ and ⑤' are the bit line voltages $V_{BL}$ of the sense amplifiers $SA_1$, $SA_n$; ⑥ and ⑥' are the bit line voltages $V_{\overline{BL}}$ in the opposite side of the sensing amplifiers $SA_1$, $SA_n$.

Figure 3:
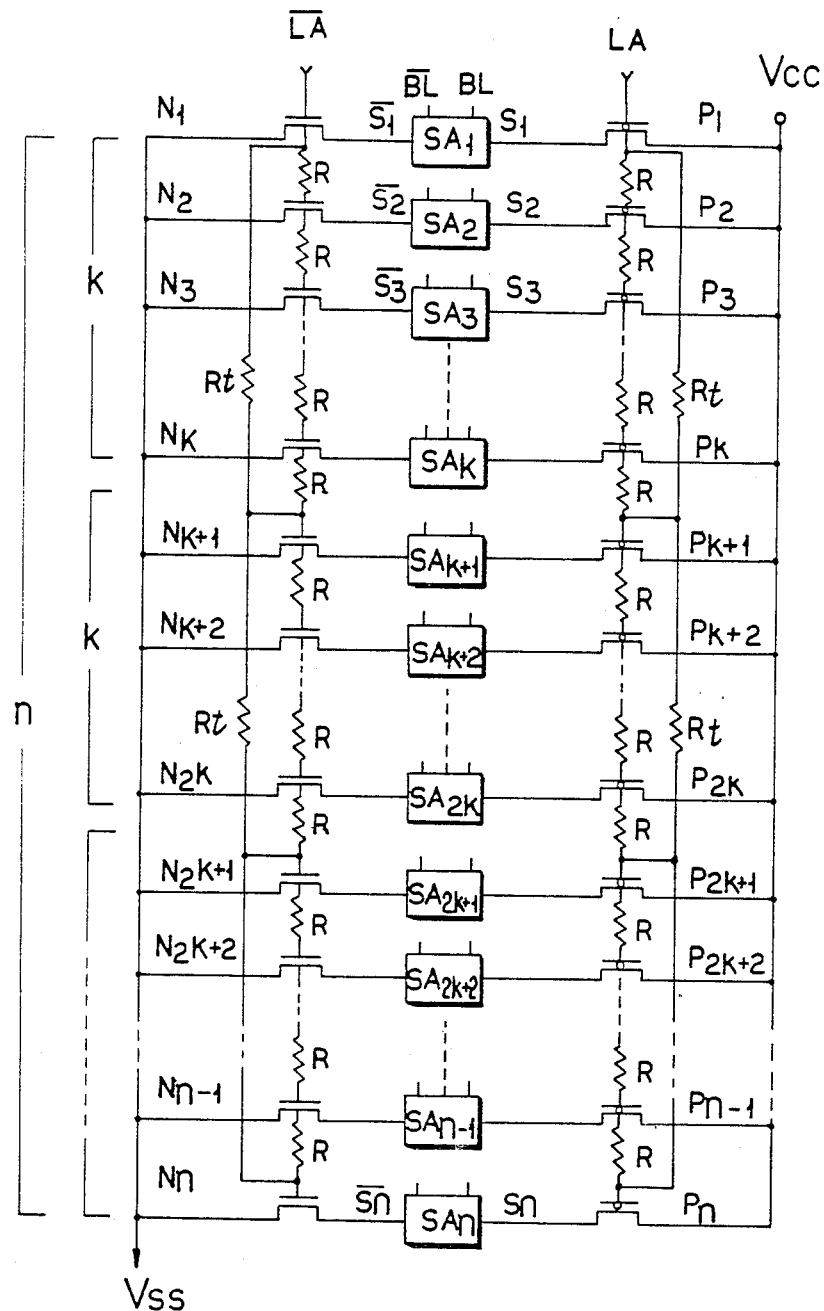
FIG. 3 is another embodiment of a distributed control circuit according to the present invention.
Figure 4:
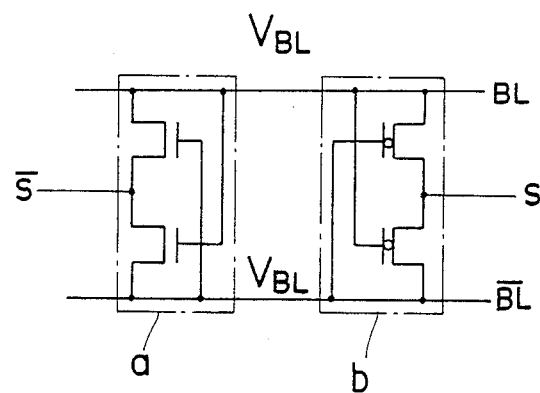
FIG. 4 shows a general sense amplifier circuit.

FIG. 3 illustrates an embodiment of the circuit according to the invention in which the $\frac{1}{2} V_{cc}$ precharge circuit PC and the equalization line (common line) for equalizing in common each of the sense amplifiers $SA_1-SA_n$ are removed. In FIG. 3, each of the sense amplifiers $SA_1-SA_n$ has a respective sensing node $\overline{S}_1-\overline{S}_n$ and $S_1-S_n$. When the sense amplifiers $SA_1-SA_n$ operate, each of the sensing node $\overline{S}_1-\overline{S}_n$ is discharged by $V_{ss}$ or charged by $V_{cc}$ with the turn-on of each of the sensing control transistors $N_1-N_n$ or $P_1-P_n$. The resistor R connected to the gate and the delay compensation resistor $R_t$ operate in the same manner as those of FIG. 2.

When the distributed control circuit of the sense amplifier in FIG. 3 may be used in collaboration with a word line strapping system which turns on in sequential each cell by a wordline signal, the operational margin of each of sense amplifiers is always maintained in a constant level because the delay times of the word line signal and the driving signal of the sense amplifier are matched as the same timing. Therefore, the decrease $\Delta V_{BL}$ of the bit line signal caused by the time-difference between the word line signal and the driving signal of the sense amplifier can be prevented.

Figure 7:
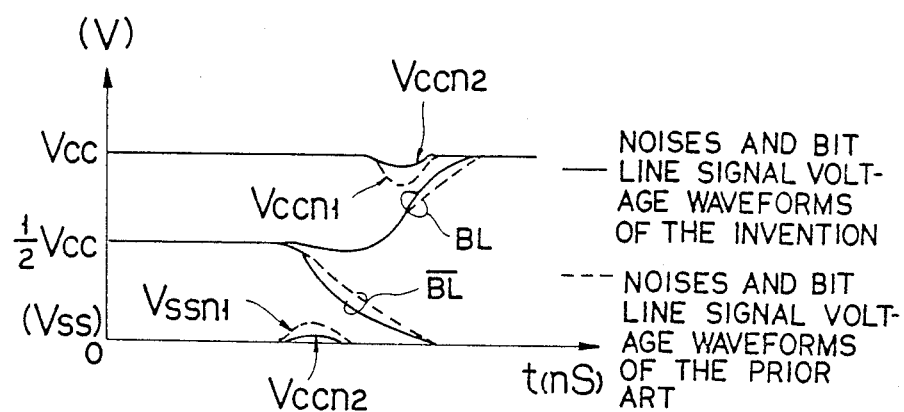
FIG. 7 shows a graph representative of noise waveforms and bit-line signal voltages of the present invention in comparison with those of a prior art.

As described above, the peak currents $I_{ss2}$, $I_{cc2}$ during sensing are reduced more than the peak currents $I_{ss1}$, $I_{cc1}$ of the prior art, as shown in FIG. 6. Accordingly, as depicted in FIG. 7, since the voltage noises $V_{ssn2}$, $V_{ccn2}$ in the power line are lower in comparison with the prior voltage noises identified by the symbols $V_{ssn1}$, $V_{ccn1}$, the signal voltages of the bit line increase and the sensing speed is improved. The reliability of the circuit is also improved.

This invention is in no way limited the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A distributed sensing control circuit for a sense amplifier of a memory device comprising:
   (a) a plurality of first sensing control transistors for controlling a plurality of sense amplifiers each having a pair of sensing nodes, each of said first sensing control transistors being connected to one of the sensing nodes of a corresponding one of said sense amplifiers, said one sensing nodes of said amplifiers being connected in common to a recharge circuit;
   (b) a plurality of second sensing control transistors for controlling the plurality of sense amplifiers, each of said second sensing control transistors being connected to one of the other sensing nodes of a corresponding one of said sense amplifiers, said other sensing nodes being connected in common to said recharge circuit;
   (c) first and second power terminals for the application therebetween of a source of power, each of said first and second control transistors and said sense amplifiers being connected between said power terminals; and
   (d) a plurality of resistor means connected one by one to each of gates of said sensing control transistors, said resistor means being connected in sequence through each of the gates of said first and second sensing control transistors, respectively, thereby arraying each of said first and second control transistors in respective first and second sequences of transistors, whereby the turn-on time of each of the sensing control transistors in each sequence is delayed in sequential order after a sensing control signal is applied to the gate of the sensing control transistor first in line in each sequence because the applied sensing control signal is delayed by said resistor means.

2. A distributed sensing control circuit for a sense amplifier of a memory device comprising:
 (a) a plurality of first sensing control transistors for controlling a plurality of sense amplifiers each having a pair of sensing nodes, each of said first sensing control transistors being connected to one of the sensing nodes of a corresponding one of said sensing amplifiers;
 (b) a plurality of second sensing control transistors for controlling the plurality of sense amplifiers, each of said second sensing control transistors being connected to one of the other sensing nodes of a corresponding one of said sensing amplifiers;
 (c) first and second power terminals for the application therebetween of a source of power, each of said first and second control transistors and said sense amplifiers being connected between said power terminals; and
 (d) a plurality of resistor means connected one by one to each of gates of said sensing control transistors, said resistor means being connected in sequence through each of the gates of said first and second sensing control transistors, respectively, thereby arraying each of said first and second control transistors in respective first and second sequences of transistors, whereby the turn-on time of each of the sensing control transistors in each sequence is delayed in sequential order after a sensing control signal is applied to the gate of the sensing control transistor first in line in each sequence because the applied sensing control signal is delayed by said resistor means.

3. A circuit according to claim 1 wherein consecutive ones of said control transistors of each of said sequences comprise groups of transistors each starting with a first one of said transistors, a pair of series connected resistance elements each extending in parallel with one of said sequences of control transistors, and means connecting each node between said resistance elements along each of said pair of series connected resistance elements with the gate of a different one of said first one of said transistors of each of said groups of transistors.

4. A distributed sensing control circuit for a sense amplifier of a memory device as claimed in claim 3, wherein each of said series connected resistance elements comprises a thin aluminum line.

5. A circuit according to claim 2 wherein consecutive ones of said control transistors of each of said sequences comprises groups of transistors each starting with a first one of said transistors, a pair of series connected resistance elements each extending in parallel with one of said sequences of control transistors, and means connecting each node between said resistance elements along each of said pair of series connected resistance elements with the gate of a different one of said first one of said transistors of each of said groups of transistors.

6. A distributed sensing control circuit for a sense amplifier of a memory device as claimed in claim 5, wherein each of said series connected resistance elements comprises a thin aluminum line.

* * * * *